United States Patent
Shuang et al.

(10) Patent No.: US 12,339,656 B2
(45) Date of Patent: Jun. 24, 2025

(54) CONTACTOR AND OPERATION METHOD THEREOF

(71) Applicant: Schneider Electric Industries SAS, Rueil-Malmaison (FR)

(72) Inventors: Bing Shuang, Shanghai (CN); Jian Gu, Shanghai (CN); Qing Ling, Shanghai (CN); Lingjie Li, Shanghai (CN)

(73) Assignee: Schneider Electric Industries SAS, Rueil-Malmaison (FR)

( * ) Notice: Subject to any disclaimer, the term of this patent is extended or adjusted under 35 U.S.C. 154(b) by 576 days.

(21) Appl. No.: 17/888,618

(22) Filed: Aug. 16, 2022

(65) Prior Publication Data
US 2023/0051985 A1 Feb. 16, 2023

(30) Foreign Application Priority Data
Aug. 16, 2021 (CN) .......................... 202110939135.4

(51) Int. Cl.
*G05B 23/02* (2006.01)
(52) U.S. Cl.
CPC ....... *G05B 23/0291* (2013.01); *G05B 23/027* (2013.01)
(58) Field of Classification Search
CPC .............. G05B 23/0291; G05B 23/027; G01R 31/3274; G01R 31/3275; H01H 9/167; H01H 1/0015
See application file for complete search history.

(56) References Cited

U.S. PATENT DOCUMENTS

| 4,780,786 A | 10/1988 | Weynachter et al. |
| 2001/0019573 A1 | 9/2001 | Dougherty et al. |

FOREIGN PATENT DOCUMENTS

| EP | 258090 A | * 3/1988 | ........... H01H 1/0015 |
| WO | 2019141529 A1 | 7/2019 | |

OTHER PUBLICATIONS

Extended European Search Report dated Jan. 16, 2023 for corresponding European Patent Application No. 1 22306226.6-1201, 5 pages.

* cited by examiner

*Primary Examiner* — Mohamad A Musleh
(74) *Attorney, Agent, or Firm* — Troutman Pepper Locke LLP

(57) ABSTRACT

The present disclosure relates to a contactor and an operation method thereof. The contactor includes a contact, a control device, a wear indication and reset device, and a memory. The control device generates and stores wear diagnosis alarm information when the contactor is disconnected; generates a switch control signal based on the wear diagnosis alarm information when the contactor is powered on. A switch unit in the wear indication and reset device enters a wear indication state based on the switch control signal, and receives a user's operation to enter a reset state. The control device receives switch state information of the switch unit, and stores it when the contactor is disconnected. When the contactor is powered on, the control device clears the wear diagnosis alarm information based on the received switch state information being the reset state and the switch state information stored being the wear indication state.

14 Claims, 5 Drawing Sheets

CONTACTOR AND OPERATION METHOD THEREOF

TECHNICAL FIELD

The present disclosure relates to a contactor and an operation method thereof.

BACKGROUND

A contactor is an electrical appliance that uses a current flowing through a coil to generate a magnetic field so as to close the contact and control the load. As time goes by, the contact of the contactor will wear. Contact wear diagnosis can predict the life of the contact based on the wear of the contact. Giving an alarm before the life of the contact is exhausted allows users to plan maintenance and replacement of the contactor and field equipment, maximize the function of contactor, reduce the number of shutdowns of users' equipment, and avoid accidents caused by exhaustion of the life of the contact, thus saving costs for users to the greatest extent and protecting users' assets and personal safety.

Contact wear diagnosis of contactors needs to be based on historical data of contactors, which are usually stored in non-volatile memory (such as electrically erasable programmable read-only memory (EEPROM)). When users replace the contact with a new one, it is necessary to clear the historical data in the memory and perform wear diagnosis according to the new contact.

SUMMARY OF THE DISCLOSURE

The present disclosure relates to a contactor and an operation method thereof, which can inform a remote user who is not at the site of the contactor of the contact wear alarm, so that the user can find out the expiration of the life of the contact and deal with it in time. The contactor and the operation method thereof can also enable users to easily reset the historical data stored in the memory, which is convenient for users to operate.

According to a first aspect of the present disclosure, a contactor is provided, which comprises a contact, a control device, a wear indication and reset device and a memory. The control device is configured to acquire wear information of the contact when the contactor is disconnected, generate wear diagnosis alarm information if wear of the contact reaches a wear threshold based on the wear information, and store the wear diagnosis alarm information in the memory. The control device is further configured to generate a switch control signal for controlling the wear indication and reset device based on the wear diagnosis alarm information stored in the memory when the contactor is powered on. The wear indication and reset device comprises a switch unit, switch states of the switch unit comprise a reset state and a wear indication state, and the switch unit is configured to enter the wear indication state based on the switch control signal, so that a remote device connected with the wear indication and reset device indicates a contact wear alarm. The switch unit is further configured to receive a user's operation to cause the switch unit to enter the reset state. The control device is further configured to receive switch state information of the switch unit from the wear indication and reset device, and store the switch state information in the memory when the contactor is disconnected. The control device is further configured to clear the wear diagnosis alarm information in the memory based on the received switch state information being the reset state and the switch state information stored in the memory being the wear indication state when the contactor is powered on.

According to a second aspect of the present disclosure, there is provided an operation method of a contactor which comprises a contact, a control device, a wear indication and reset device and a memory. The wear indication and reset device comprises a switch unit, and switch states of the switch unit comprise a reset state and a wear indication state. The operation method comprises the following steps: receiving switch state information of the switch unit from the wear indication and reset device by the control device; when the contactor is disconnected, acquiring wear information of the contactor, generating wear diagnosis alarm information if wear of the contactor reaches a wear threshold based on the wear information, and storing the wear diagnosis alarm information and the switch state information in the memory by the control device; generating a switch control signal for controlling the wear indication and reset device based on the wear diagnosis alarm information stored in the memory when the contactor is powered on by the control device; entering the wear indication state based on the switch control signal by the control device, so that the remote device connected with the wear indication and reset device indicates a contact wear alarm. The method further comprises the following steps: receiving a user's operation to cause the switch unit to enter the reset state by the switch unit; clearing the wear diagnosis alarm information in the memory based on the received switch state information being the reset state and the switch state information stored in the memory being the wear indication state when the contactor is powered on by the control device.

BRIEF DESCRIPTION OF THE DRAWINGS

The aspects, features and advantages of the present disclosure will become clearer and easier to understand through the following description of the embodiments in conjunction with the accompanying drawings, among which.

DESCRIPTION OF THE EMBODIMENTS

The present disclosure will be described in detail below with reference to exemplary embodiments of the present disclosure. However, the present disclosure is not limited to the embodiments described here, which can be implemented in many different forms. The described embodiments are only used to make this disclosure thorough and complete, and fully convey the concept of this disclosure to those skilled in the art. The features of the described embodiments can be combined or replaced with each other, unless explicitly excluded or should be excluded according to the context.

At present, the contact wear alarm is carried out by flashing LED lights at the contactor, and the remote user cannot know the alarm immediately. In addition, after the user replaces the contact with a new one, clearing (i.e., resetting) the historical data related to the contact in the memory requires the user to perform in a very complicated manner in combination with other devices, which brings inconvenience to the user's operation.

The embodiments of the present disclosure provide a contactor and an operation method thereof, which can inform a remote user who is not at the site of the contactor of the contact wear alarm, so that the user can find out the expiration of the life of the contact and deal with it in time. The contactor and the operation method thereof can also enable the user to easily reset the historical data stored in the memory, which is convenient for users to operate.

Figure 1:
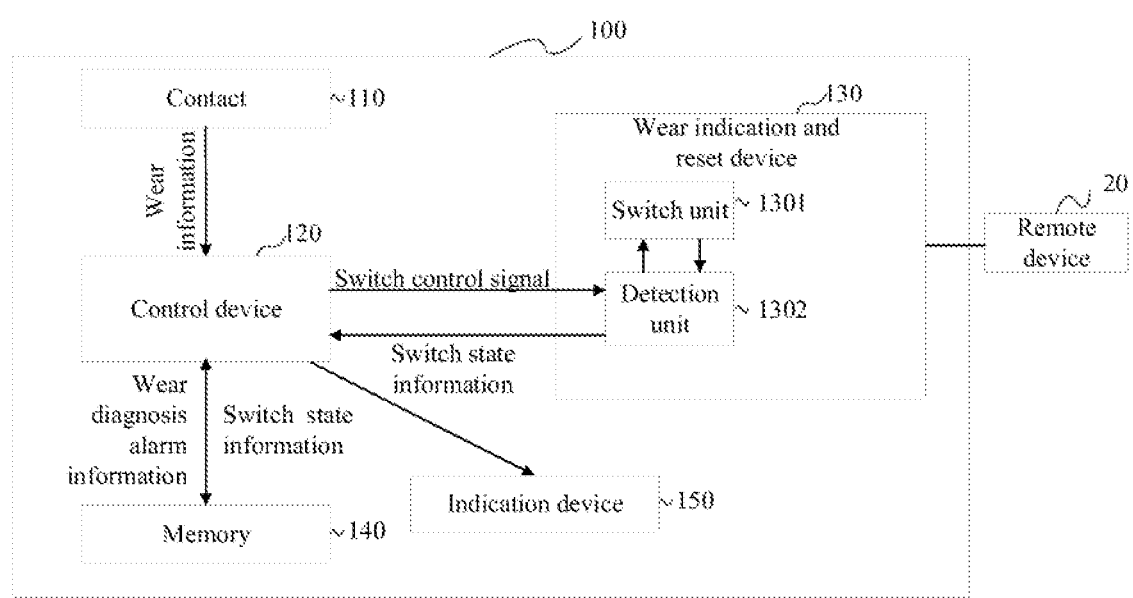
FIG. 1 is a schematic diagram of a contactor and a remote device connected thereto according to an embodiment of the present disclosure.

FIG. 1 is a schematic diagram of a contactor 100 and a remote device 20 connected thereto according to an embodiment of the present disclosure. The contactor 100 includes a contact 110, a control device 120, a wear indication and reset device 130 and a memory 140. As time goes by, the contact 110 will wear. The control device 120 can acquire wear information of the contact 110 when the contactor 100 is disconnected, and generate wear diagnosis (WD) alarm information if the wear of the contact 110 reaches a wear threshold based on the wear information. Those skilled in the art can obtain the wear information of the contact 110 by any known way of obtaining the wear information of the contact. For example, the control device 120 can obtain the wear information of the contact 110 based on the voltage collected by the coil voltage sampling circuit (not shown) of the contactor 100, thereby further judge whether the wear of the contact 110 reaches the wear threshold based on the wear information, and generate the WD alarm information after judging that the wear of the contact 110 reaches the wear threshold.

After generating the WD alarm information, the control device 120 can also store the WD alarm information in the memory 140 of the contactor 100 when the contactor 100 is disconnected. The memory 140 can be a non-volatile memory, such as an electrically erasable programmable read-only memory (EEPROM), so as to save the WD alarm information as historical information after the contactor 100 is powered off.

When the contactor 100 is powered on, the control device 120 can generate a switch control signal for controlling the wear indication and reset device 130 based on WD alarm information stored in the memory 140. Specifically, the wear indication and reset device 130 can include a switch unit 1301, switch states of the switch unit 1301 can include a reset state and a wear indication state, and the switch control signal can control the switch unit 1301 to enter the wear indication state. The switch unit 1301 can also receive the user's operation to enter the above reset state. For example, the user can cause the switch unit 1301 to enter the above reset state by pressing the button on the wear indication and reset device 130. In one example, the switch unit 1301 can be a bistable relay, and the reset state and the wear indication state correspond to its normally closed state and normally open state, respectively.

After the switch unit 1301 enters the wear indication state, the remote device 20 connected with the wear indication and reset device 130 will be triggered accordingly, thereby indicating the contact wear alarm. The remote device 20 can, for example, include a Light Emitting Diode (LED) lamp or a Programmable Logic Controller (PLC) device, which can, for example, sound (e.g., by beeping) or light (e.g., by flashing an LED) to give a contact wear alarm. Therefore, through the arrangement of the above-mentioned control device 120 and the wear indication and reset device 130, the remote device 20 can indicate the contact wear alarm, thereby informing the remote user of the contact wear, so that even if the user is not at the site, he can find out the expiration of the life of the contact and arrive at the site to deal with it in time.

In response to the expiration of the life of the contact of the contactor, the user can replace the contact 110 during the power-off of the contactor 100. Then the user may wish to clear the historical information in the memory 140 through a simple operation, so that wear diagnosis of the new contact can be performed. The contactor 100 according to the embodiment of the present disclosure can receive the user's operation through the switch unit 1301 to realize the above functions, and the specific principle is as follows.

If the life of the contact of the contactor expires, the control device 120 will generate a switch control signal, so that the switch unit 1301 will enter the wear indication state, and the remote device 20 will indicate the contact wear alarm. After the user knows this alarm, he will replace the contact 110 during the power-off of the contactor 100, and then he can operate (for example, press the button on the wear indication and reset device 130) to cause the switch unit 1301 to enter the reset state. In this way, when the contactor 100 is powered on again, the switch unit 1301 is in a reset state. Based on the difference between the switch states of the switch unit 1301 before power-off and at power-on, it can be determined that the user has replaced the contact 110 and instructed the reset operation during the power-off of the contactor 100, so that the WD alarm information stored in the memory 140 can be cleared. Therefore, according to the embodiment of the present disclosure, the control device 120 can receive the switch state information of the switch unit 1301 from the wear indication and reset device 130, and store the switch state information in the memory 140 when the contactor 100 is disconnected. As mentioned above, the memory 140 can be a non-volatile memory, so that the switch state information can be saved as historical information after the contactor 100 is powered off. That is, the switch state information stored in the memory 140 can indicate the switch state of the switch unit 1301 before the contactor 100 is powered off. In this way, when the contactor 100 is powered on, the control device 120 can judge whether the user has instructed the reset operation (i.e., to clear the WD alarm information stored in the memory 140) based on the comparison between the received switch state information (which indicates the switch state of the switch unit 1301 at power-on of the contactor 100) and the switch state information stored in the memory 140 (which indicates the switch state of the switch unit 1301 before power-off). That is, when the contactor 100 is powered on, the control device 120 can clear the WD alarm information in the memory 140 based on the received switch state information being the reset state and the switch state information stored in the memory 140 being the wear indication state, thereby realizing the reset of the memory 140. Therefore, through the above arrangement of the control device 120 and the wear indication and reset device 130, the user can easily reset the historical data stored in the memory by conveniently operating the wear indication and reset device 130.

In addition, as an example, the contactor 100 can also include an indication device 150 just as the known contactors. In the event that the control device 120 determines that the life of the contact of the contactor has expired, the control device 120 causes the indication device 150 to indicate the contact wear alarm in the form of, for example, sound (e.g., by beeping) or light (e.g., by flashing an LED) at the contactor site.

Through the arrangement of the control device 120 and the wear indication and reset device 130, the contactor 100 according to the embodiments of the present disclosure can inform the remote user of the contact wear alarm, so that the user can find out the expiration of the life of the contact and deal with it in time, and it is also possible for the user to easily reset the historical data stored in the memory, which is convenient for the user to operate.

If the above-mentioned wear indication and reset device 130 is not provided in the contactor, the control device 120 does not need to perform the operations related thereto, but controls the indication device of the contactor to indicate the contact wear alarm based on WD alarm information (e.g., by flashing an LED at the contactor) or clears the WD alarm information in the memory based on the user's operation (e.g., as mentioned above, the user needs to do it in a very complicated way in combination with other devices) as in the known contactor. Therefore, in one embodiment, the control device 120 also receives the connection information from the wear indication and reset device 130, and performs the interactive operation related to the wear indication and reset device 130 only if the connection information is received so that it is determined that the wear indication and reset device 130 is connected, otherwise, those operations in known contactors are performed. Therefore, as shown in FIG. 1, the contactor 100 can also include an indication device 150 like a known contactor. In case the control device 120 is not connected with the wear indication and reset device 130, the control device 120 causes the indication device 150 to indicate the contact wear alarm based on the WD alarm information or clears the WD alarm information in the memory 140 based on the user's operation. The indication device 150 can indicate the contact wear alarm in the form of, for example, sound (e.g., by beeping) or light (e.g., by flashing an LED). By doing so, the efficiency of the contactor 100 can be improved and its normal operation can be ensured.

In an embodiment, as shown in FIG. 1, the wear indication and reset device 130 can include a detection unit 1302 to realize the above-mentioned interaction with the control device 120. Specifically, the detection unit 1302 can transmit the connection information as described above to the control device 120. The detection unit 1302 can also detect the switch control signal from the control device 120 and transmit it to the switch unit 1301. Further, the detection unit 1302 can also detect the switch state of the switch unit 1301 and transmit switch state information generated based on the switch state to the control device 120.

As described above, the switch unit 1301 should enter the wear indication state based on the switch control signal, so that the remote device 20 connected to the wear indication and reset device 130 indicates the contact wear alarm. However, in some cases (e.g., malfunctioning), the switch unit 1301 may not enter the wear indication state based on the switch control signal, so that the remote device 20 does not correspondingly indicate the contact wear alarm. An error reporting mechanism needs to be set to indicate the above situation to the user. Therefore, in one embodiment, after a predetermined time threshold (e.g., 46 seconds) has elapsed since the control device 120 generated the switch control signal, if the switch state information of the switch unit 1301 received by the control device 120 from the wear indication and reset device 130 is the reset state, the control device 120 can determine that the switch unit 1301 is not operating properly, thereby generating a switch unit state error indication signal, so that the indication device 150 indicates the state error of the switch unit 1301. For example, the indication device 150 can indicate the state error of the switch unit 1301 in the form of sound (e.g., by beeping) or light (e.g., by flashing an LED). In this way, the state error of the switch unit 1301 can be found out and indicated to the user in time, thus ensuring the high reliability and fault tolerance of the contactor 100.

According to the previous discussion, the control device 120 can generate a switch control signal for controlling the wear indication and reset device 130 based on the WD alarm information stored in the memory 140, and the switch unit 1301 can enter the wear indication state based on the switch control signal. It can be understood that the premise that the switch unit 1301 enters the wear indication state so that the remote device 20 connected to the wear indication and reset device 130 can indicate the contact wear alarm is that the life of the contact expires, that is, there is WD alarm information in the memory 140. In addition, since WD alarm information is historical information stored in the memory 140 when the contactor 100 is disconnected, and the switch control signal is generated when the contactor 100 is powered on, it is also necessary to determine whether the switch unit 1301 has performed related operations in response to the previously generated switch control signal. In one embodiment, to avoid misoperation, the switch control signal can be generated in combination with the switch state information of the switch unit 1301 to control the switch unit 1301. It can be understood that if the switch unit 1301 has not performed any related operations in response to the previously generated switch control signal, the switch state information of the switch unit 1301 should be the same when the contactor 100 is disconnected and when the contactor 100 is powered on, that is, both should be the reset state. Therefore, the generation of the above-mentioned switch control signal by the control device 120 can be designed to meet the following conditions: WD alarm information exists, and the switch state information received by the control device 120 when the contactor 100 is powered on is the reset state and the switch state information stored in the memory 140 is the reset state. In this way, misoperation can be avoided, and the high reliability and fault tolerance of the contactor 100 can be ensured.

Under normal circumstances, the switch unit 1301 should enter the wear indication state based on the switch control signal and enter the reset state based on the user's operation. However, the switch state of the switch unit 1301 can also change due to environmental reasons or the like, resulting in a state error thereof. For example, one type of state error can be that the switch state information stored in the memory 140 (indicating the switch state of the switch unit 1301 before the contactor 100 is powered off) is the reset state, while the switch state information received by the control device 120 when the contactor 100 is powered on (indicating the current switch state of the switch unit 1301) is the wear indication state. This indicates that a state change of the switch state of the switch unit 1301 from the reset state to the wear indication state occurs during the power-off of the contactor 100, and this state change can only occur during the power-on of the contactor 100. The control device 120 can be designed to detect this state error and inform the user. Therefore, in one embodiment, if the switch state information received by the control device 120 when the contactor 100 is powered on is the wear indication state and the switch state information stored in the memory 140 is the reset state, the control device 120 can generate the switch unit state error indication signal to cause the indication device 150 to indicate the state error of the switch unit 1301. For example, the indication device 150 can indicate the state error of the switch unit 1301 in the form of sound (e.g., by beeping) or light (e.g., by flashing an LED). In this way, the state error of the switch unit 1301 can be found out and indicated to the user in time, thus ensuring the high reliability and fault tolerance of the contactor 100.

The user may mistakenly operate the wear indication and reset device 130 during the power-on of the contactor 100, for example, causing the switch unit 1301 to enter the reset state by operations such as pressing a button on the wear indication and reset device 130. This is not allowed, because only when the contactor 100 is powered off, the user can replace the contact, and then operate to cause the switch unit 1301 to enter the reset state, so as to clear the WD alarm information in the memory 140 and realize the reset of the memory 140. Therefore, it is necessary to set up an error reporting mechanism to indicate the above situation to users. The control device 120 can be designed to detect this misoperation and inform the user. In one embodiment, if the switch state information received by the control device 120 during the power-on of the contactor 100 changes from the wear indication state to the reset state, the control device 120 can generate a misoperation indication signal to cause the indication device 150 indicate the misoperation of the user. For example, the indication device 150 can indicate the user's misoperation in the form of sound (e.g., by beeping) or light (e.g., by flashing an LED). In this way, the misoperation can be found out and indicated to the user in time, thus ensuring the high reliability and fault tolerance of the contactor 100.

As mentioned above, both the indication device 150 and the remote device 20 can indicate various state errors, misoperations or alarms in the form of, for example, sound (e.g., by beeping) or light (e.g., by flashing an LED). Different sound and light modes can be set to distinguish different errors, misoperations or alarms. For example, different tones, different sound durations or frequencies, different colors of light, different light flashing time durations or frequencies, etc. can be set.

In one example, the control device 120 can be a micro control unit (MCU) of the contactor 100.

In one example, the control device 120 can also be provided with different functional units to realize its functions. For example, the control device 120 can be provided with a wear diagnosis unit (not shown) configured to acquire the wear information of the contact 110 when the contactor 100 is disconnected, and generate WD alarm information if the wear of the contact 110 reaches the wear threshold based on the wear information. An information access unit (not shown) can also be provided in the control device 120 to obtain WD alarm information and switch state information of the switch unit 1301 when the contactor 100 is disconnected, and store them in the memory 140. A control unit (not shown) can also be provided in the control device 120, which can be configured to perform the following actions: receiving the switch state information of the switch unit 1301; generating the switch control signal for controlling the wear indication and reset device 130 based on the WD alarm information stored in the memory 140 when the contactor 100 is powered on; and clearing the WD alarm information in the memory 140 based on the received switch state information being the reset state and the switch state information stored in the memory 140 being the wear indication state when the contactor 100 is powered on.

In one example, the control device 120 can supply power to the wear indication and reset device 130.

The functions of various units shown in the drawings can be provided by using dedicated hardware and hardware capable of executing software in conjunction with appropriate software. When the function is provided by a processor, the function can be provided by a single dedicated processor, a single shared processor, or a plurality of individual processors, some of which can be shared. In addition, the explicit use of the term "processor" or "controller" should not be interpreted as exclusively referring to hardware capable of executing software, but can implicitly and without limitation include digital signal processor ("DSP") hardware as well as read only memory ("ROM"), random access memory ("RAM"), and non-volatile memory for storing software.

The contactor according to embodiments of the present disclosure can inform the remote user of contact wear alarm, so that the user can find out the expiration of the life of the contact and deal with it in time, and the user can easily reset the historical data, which is convenient for the user to operate. In addition, the contactor according to the embodiments of the present disclosure also has high reliability and fault tolerance, and can indicate various state errors or misoperations.

Figure 2:
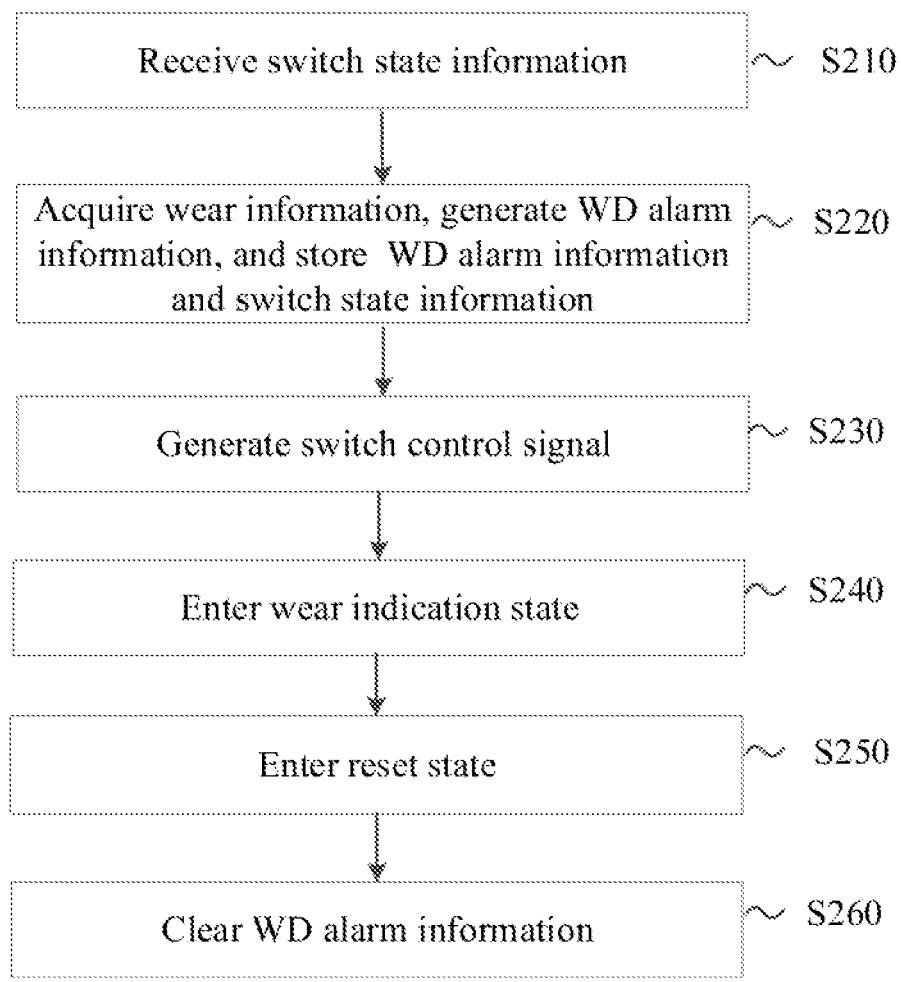
FIG. 2 is a flowchart of an operation method of a contactor according to an embodiment of the present disclosure.

FIG. 2 is a flowchart of an operation method 200 of a contactor according to an embodiment of the present disclosure. The contactor can be, for example, the contactor 100 described above, which can include the contact 110, the control device 120, the wear indication and reset device 130, and the memory 140. The wear indication and reset device 130 can include the switch unit 1301, and the switch state of the switch unit 1301 includes the reset state and the wear indication state. The operation method 200 of FIG. 2 will be described below with reference to FIG. 1. As shown in FIG. 2, the operation method 200 can include steps S210 to S260. The method 200 starts at step S210, in which the control device 120 can receive the switch state information of the switch unit 1301 from the wear indication and reset device 130. At step S220, when the contactor 100 is disconnected, the control device 120 can acquire the wear information of the contact 110, generate the wear diagnosis (WD) alarm information if the wear of the contact 110 reaches the wear threshold based on the wear information, and store the WD alarm information and the switch state information of the switch unit 1301 in the memory 140. At step S230, when the contactor 100 is powered on, the control device 120 can generate the switch control signal for controlling the switch unit 1301 based on the WD alarm information stored in the memory 140. At step S240, the switch unit 1301 can enter the wear indication state based on the switch control signal, so that the remote device 20 connected to the wear indication and reset device 130 indicates the contact wear alarm. In response to the remote device 20 indicating the contact wear alarm, the user can replace the contact, and then can perform an operation (e.g., pressing a button on the wear indication and reset device 130) to indicate the reset operation (i.e., clearing the WD alarm information stored in the memory 140). Therefore, the operation method 200 can further include receiving the user's operation through the switch unit 1301 to cause the switch unit 1301 enter the reset state at step S250. Then, at step S260, when the contactor 100 is powered on, the control device 120 can clear the WD alarm information in the memory 140 based on the received switch state information being the reset state and the switch state information stored in the memory 140 being the wear indication state.

The operation method 200 according to embodiments of the present disclosure can inform the remote user of contact wear alarm, so that the user can find out the expiration of the life of the contact and deal with it in time, and the user can easily reset the historical data, which is convenient for the user to operate.

Figure 3:
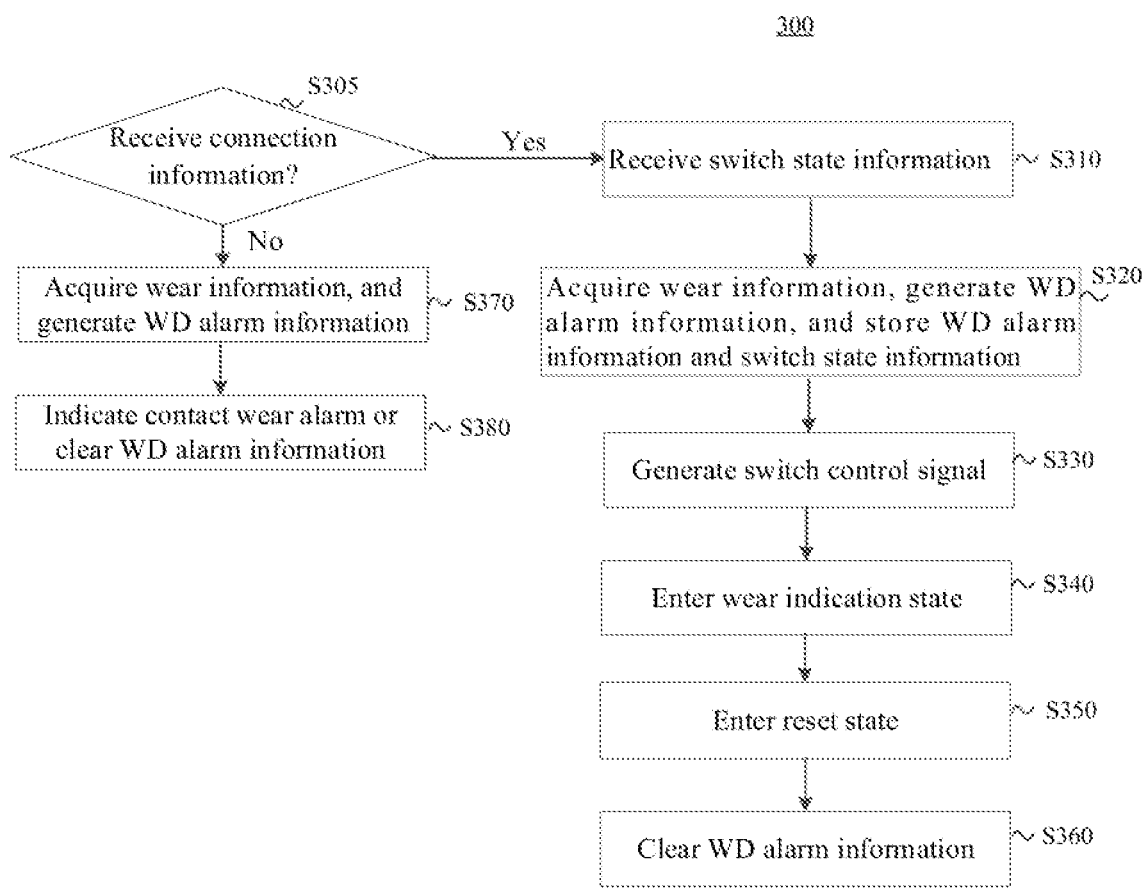
FIG. 3 is a flowchart of an operation method of a contactor according to an embodiment of the present disclosure.

As described above, if the above-mentioned wear indication and reset device 130 is not provided in the contactor, the control device 120 does not need to perform the operations related thereto, but controls the indication device of the contactor to indicate the contact wear alarm based on WD alarm information (e.g., by flashing an LED at the contactor) or clears the WD alarm information in the memory based on the user's operation as in the known contactor. FIG. 3 is a flowchart of an operation method 300 of such a contactor according to an embodiment of the present disclosure. The contactor can be, for example, the contactor 100 described above, which can include the contact 110, the control device 120, the wear indication and reset device 130, the memory 140 and the indication device 150. The wear indication and reset device 130 can include the switch unit 1301, and the switch state of the switch unit 1301 includes the reset state and the wear indication state. As shown in FIG. 3, the operation method 300 includes steps S305 to S380. At step S305, the control device 120 can receive the connection information from the wear indication and reset device 130. If the connection information is received at step S305, the contactor can perform the steps of the operation method 200 described above with reference to FIG. 2, that is, steps S310 to S360 correspond to steps S210 to S260 of FIG. 2, respectively. If the connection information is not received at step S305, the contactor can perform those operations performed in known contactors, that is, at step S370, the control device 120 can acquire the wear information, and generate the WD alarm information if the wear of the contact 110 reaches the wear threshold based on the wear information. At step S380, the control device 120 can cause the indication device 150 to indicate the contact wear alarm based on the WD alarm information or clear the WD alarm information in the memory 140 based on the user's operation. The indication device 150 can indicate the contact wear alarm, for example, in the form of sound (e.g., by beeping) or light (e.g., by flashing an LED). By doing so, the efficiency of the contactor 100 can be improved and its normal operation can be ensured.

Figure 4:
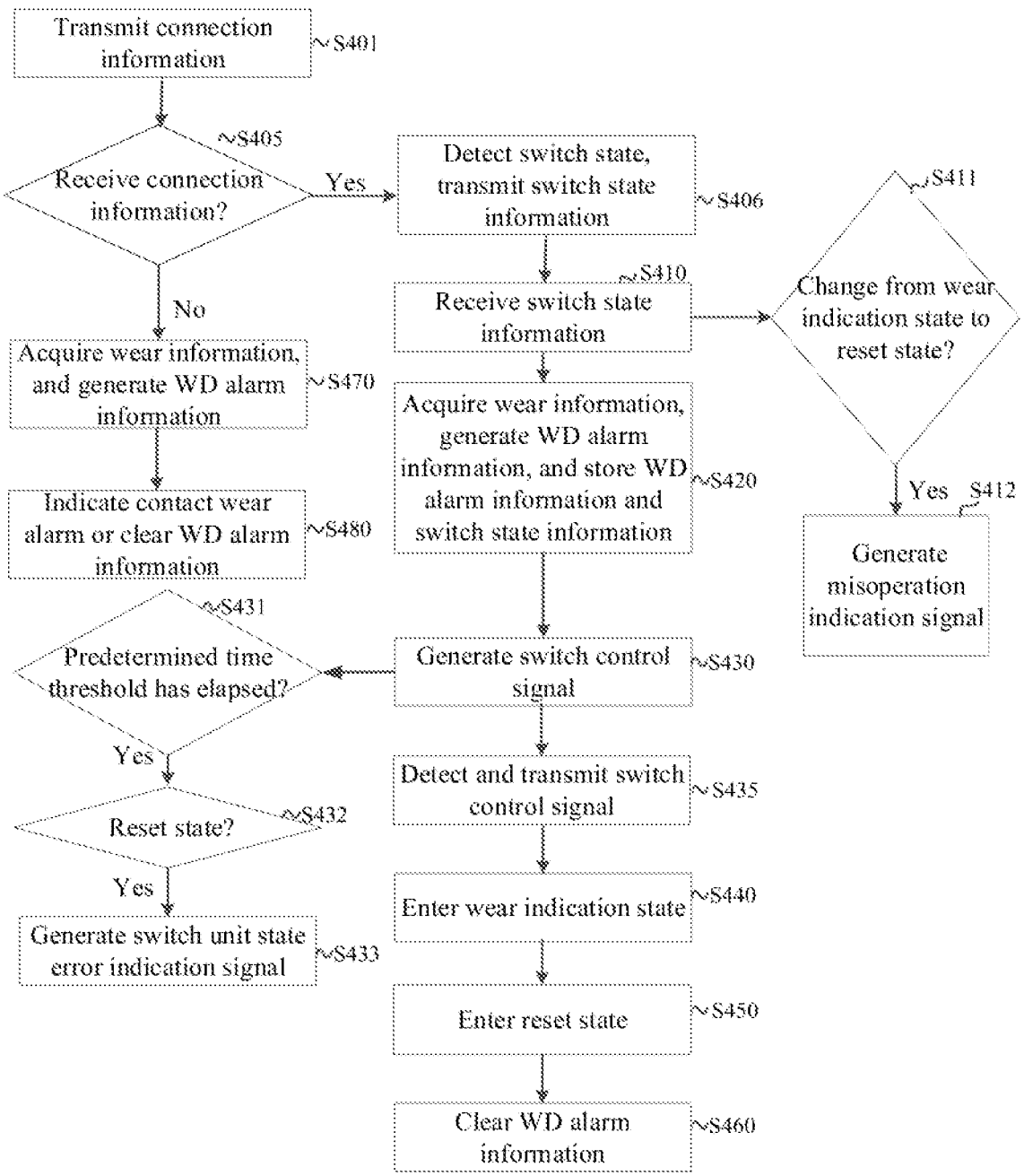
FIG. 4 is a flowchart of an operation method of a contactor according to an embodiment of the present disclosure.

As described above, the wear indication and reset device 130 in the contactor 100 can include the detection unit 1302 to realize the above-mentioned interaction with the control device 120. FIG. 4 is a flowchart of an operation method 400 of such a contactor according to an embodiment of the present disclosure. As shown in FIG. 4, the operation method 400 includes steps S401, S405, S406, S410, S420, S430, S435, S440, S450, S460, S470 and S480. Steps S405, S410, S420, S430, S440, S450, S460, S470 and S480 respectively correspond to steps S305, S310, S320, S330, S340, S350, S360, S370 and S380 of FIG. 3. The method 400 is different from the method 300 of FIG. 3 in that it further includes steps S401, S406 and S435 performed by the detection unit 1302. At step S401, the connection information can be transmitted to the control device 120 by the detection unit 1302. At step S406, the switch state of the switch unit 1301 can be detected by the detection unit 1302 and the switch state information generated based on the switch state can be transmitted to the control device 120 by the detection unit 1302, so that the control device 120 can receive the switch state information at step S410. At step S435, the switch control signal from the control device 120 can be detected and transmitted to the switch unit 1301 by the detection unit 1302, so that the switch unit 1301 can enter the wear indication state based on the switch control signal at step S440.

It should be noted that although the steps are described above in a specific order, this should not be understood as requiring the steps to be performed in the described specific order or sequential order. For example, the above-mentioned steps S401 and S406 can be performed in parallel, and the above-mentioned steps S406 and S410 can be continuously performed during the power-on of the contactor, regardless of whether steps S420 to S480 are performed, and so on.

As described above, the switch unit 1301 should enter the wear indication state based on the switch control signal, so that the remote device 20 connected to the wear indication and reset device 130 indicates the contact wear alarm. However, in some cases (e.g., malfunctioning), the switch unit 1301 may not enter the wear indication state based on the switch control signal, so that the remote device 20 does not correspondingly indicate the contact wear alarm. An error reporting mechanism needs to be set to indicate the above situation to the user. Therefore, in one embodiment, the above operation method 400 can further include steps S431 to S433 performed by the control device 120 after step S430. At step S431, the control device 120 can determine whether a predetermined time threshold (e.g., 46 seconds) has elapsed since it generated the switch control signal. If it is determined that the predetermined time threshold has elapsed, at step S432, the control device 120 can determine whether the switch state information of the switch unit 1301 received from the wear indication and reset device 130 is the reset state. If it is determined that the received switch state information of the switch unit 1301 is the reset state, at step S433, the control device 120 can determine that the switch unit 1301 is not operating properly, thereby generating the switch unit state error indication signal, so that the indication device 150 indicates the state error of the switch unit 1301. For example, the indication device 150 can indicate the state error of the switch unit 1301 in the form of sound (e.g., by beeping) or light (e.g., by flashing an LED). In this way, the state error of the switch unit 1301 can be found out and indicated to the user in time, thus ensuring the high reliability and fault tolerance of the contactor 100.

Figure 5:
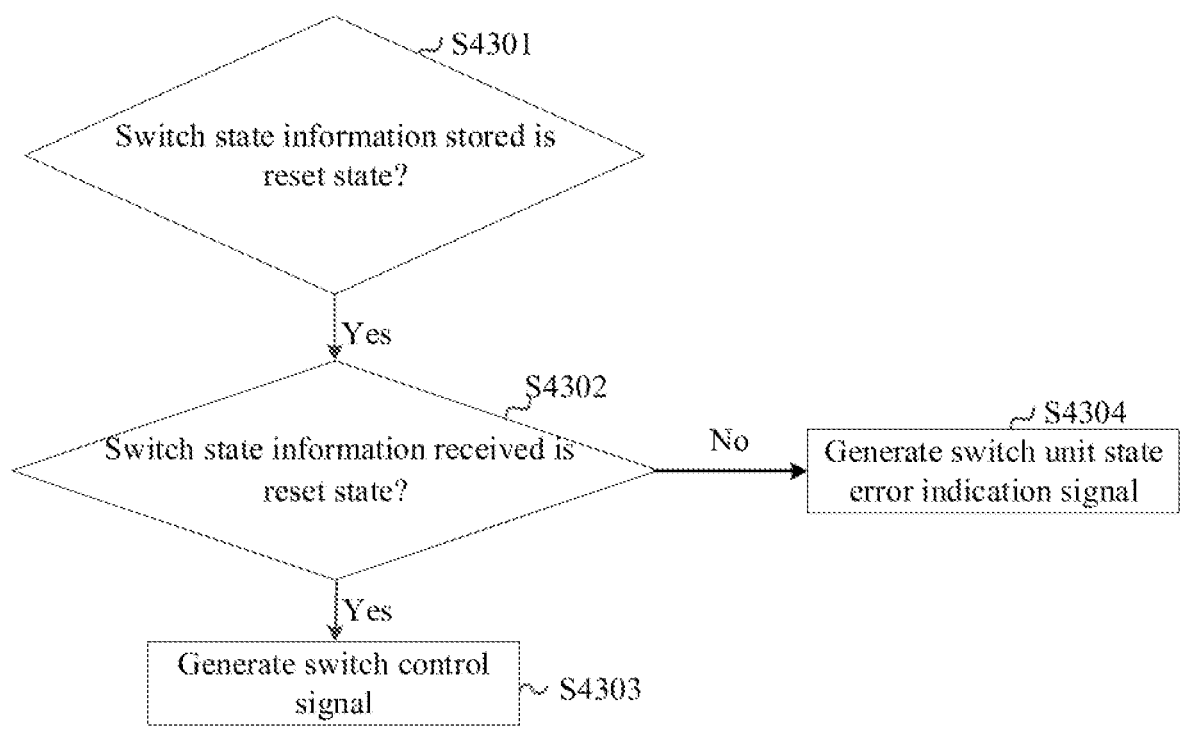
FIG. 5 is a diagram showing sub-steps of one step in the flowchart of FIG. 4.

In addition, as described above, to avoid misoperation, the switch control signal can be generated in combination with the switch state information of the switch unit 1301 to control the switch unit 1301. Therefore, in one embodiment, the above step S430 can include the judgment of the switch state information of the switch unit 1301. FIG. 5 is a diagram showing sub-steps of step S430. As shown in FIG. 5, at sub-step S4301, the control device 120 can determine whether the switch state information stored in the memory 140 is the reset state. At sub-step S4302, the control device 120 can determine whether the switch state information it receives is the reset state when the contactor 100 is powered on is the reset state. If the determination results at sub-steps S4301 and S4302 are both yes, the control device 120 generates the switch control signal based on WD alarm information at sub-step S4303. In this way, misoperation can be avoided, and the high reliability and fault tolerance of the contactor 100 can be ensured.

In addition, as mentioned above, the switch state of the switch unit 1301 can also change due to environmental reasons or the like, resulting in a state error thereof. For example, one type of state error can be that the switch state information stored in the memory 140 (indicating the switch state of the switch unit 1301 before the contactor 100 is powered off) is the reset state, while the switch state information received by the control device 120 when the contactor 100 is powered on (indicating the current switch state of the switch unit 1301) is the wear indication state. The control device 120 can be designed to detect this state error and inform the user. Therefore, as shown in FIG. 5, in one embodiment, step S430 can further include a sub-step S4304. If the control device 120 determines that the switch state information stored in the memory 140 is the reset state at sub-step S4301, and the control device 120 determines that the switch state information it receives when the contactor 100 is powered on is not the reset state (i.e., the wear indication state) at sub-step S4302, then the control device 120 can generate the switch unit state error indication signal at sub-step S4304 to cause the indication device 150 to indicate the state error of the switch unit 1301. For example, the indication device 150 can indicate the state error of the switch unit 1301 in the form of sound (e.g., by beeping) or light (e.g., by flashing an LED). In this way, the state error of the switch unit 1301 can be found out and indicated to the user in time, thus ensuring the high reliability and fault tolerance of the contactor 100.

The user may mistakenly operate the wear indication and reset device 130 during the power-on of the contactor 100, for example, causing the switch unit 1301 to enter the reset state by operations such as pressing a button on the wear indication and reset device 130. This is not allowed, because only when the contactor 100 is powered off, the user can replace the contact, and then operate to cause the switch unit 1301 to enter the reset state, so as to clear the WD alarm information in the memory 140 and realize the reset of the memory 140. Therefore, it is necessary to set up an error reporting mechanism to indicate the above situation to users. The control device 120 can be designed to detect this misoperation and inform the user. Referring back to FIG. 4, in one embodiment, after step S410, steps S411 to S412 can be further included. At step S411, the control device 120 determines whether the switch state information it receives changes from the wear indication state to the reset state during the power-on of the contactor 100. If it is determined as yes, at step S412, the control device 120 can generate a misoperation indication signal to cause the indication device 150 indicate the misoperation of the user. For example, the indication device 150 can indicate the user's misoperation in the form of sound (e.g., by beeping) or light (e.g., by flashing an LED). In this way, the misoperation can be found out and indicated to the user in time, thus ensuring the high reliability and fault tolerance of the contactor 100.

As mentioned above, both the indication device 150 and the remote device 20 can indicate various state errors, misoperations or alarms in the form of, for example, sound (e.g., by beeping) or light (e.g., by flashing an LED). Different sound and light modes can be set to distinguish different errors, misoperations or alarms. For example, different tones, different sound durations or frequencies, different colors of light, different light flashing time durations or frequencies, etc. can be set.

The operation method of the contactor according to the embodiments of the present disclosure can inform the remote user of the contact wear alarm, so that the user can find the expiration of the life of the contact and deal with it in time, and the user can easily reset the historical data, which is convenient for the user to operate. In addition, the operation method of the contactor according to the embodiments of the present disclosure also has high reliability and fault tolerance, and can indicate various state errors or misoperations.

The block diagrams of devices, equipment and systems involved in this disclosure are only exemplary, and are not intended to require or imply that they must be connected, arranged and configured in the way shown in the block diagrams. As those skilled in the art will realize, these circuits, devices, apparatuses, equipment and systems can be connected, arranged and configured in any way, as long as the desired purpose can be achieved.

The process and logic flow described in this specification can be performed by one or more programmable processors that execute one or more computer programs to perform functions by operating on input data and generating output. The processes and logic flows can also be performed by, and devices can also be implemented as, special purpose logic circuitry, e.g., an FPGA (field programmable gate array) or an ASIC (application specific integrated circuit).

Although the operations are described in a specific order in the drawings, this should not be understood as requiring that these operations be performed in the specific order or sequential order shown, or that all the shown operations be performed to obtain the desired results. In some cases, multitasking and parallel processing can be advantageous.

Some features described in this specification in the context of separate embodiments can also be combined. Conversely, various features that are described in the context of a separate embodiment can also be implemented in multiple embodiments separately or in any suitable subcombination.

It should be understood by those skilled in the art that the above-mentioned specific embodiments are only examples but not limitations, and various modifications, combinations, partial combinations and substitutions can be made to the embodiments of the present disclosure according to design requirements and other factors, so long as they are within the scope of the appended claims or their equivalents, that is, they belong to the scope of rights to be protected by the present disclosure.

What is claimed is:

1. A contactor comprising a contact, a control device, a wear indication and reset device, and a memory, wherein,
    the control device is configured to acquire wear information of the contact when the contactor is disconnected, generate wear diagnosis alarm information if wear of the contact reaches a wear threshold based on the wear information, and store the wear diagnosis alarm information in the memory;
    the control device is further configured to generate a switch control signal for controlling the wear indication and reset device based on the wear diagnosis alarm information stored in the memory when the contactor is powered on;
    the wear indication and reset device comprises a switch unit, switch states of the switch unit comprise a reset state and a wear indication state, and the switch unit is configured to enter the wear indication state based on the switch control signal, so that a remote device connected with the wear indication and reset device indicates a contact wear alarm;
    the switch unit is further configured to receive a user's operation to cause the switch unit enter the reset state;
    the control device is further configured to receive switch state information of the switch unit from the wear indication and reset device, and store the switch state information in the memory when the contactor is disconnected,
    the control device is further configured to clear the wear diagnosis alarm information in the memory based on the received switch state information being the reset state and the switch state information stored in the memory being the wear indication state when the contactor is powered on.

2. The contactor according to claim 1, wherein the contactor further comprises an indication device, and the control device further receives connection information from the wear indication and reset device, if the connection information is not received, the control device does not perform operations related to the wear indication and reset device, but causes the indication device to indicate contact wear alarm based on the wear diagnosis alarm information or clears the wear diagnosis alarm information in the memory based on the user's operation.

3. The contactor according to claim 2, wherein the wear indication and reset device further comprises a detection unit which is configured to:
   transmit the connection information to the control device;
   detect the switch control signal from the control device and transmit it to the switch unit; and
   detect a switch state of the switch unit, and transmit switch state information generated based on the switch state to the control device.

4. The contactor according to claim 1, wherein the contactor further comprises an indication device, after a predetermined time threshold has elapsed since the control device generated the switch control signal, if the switch state information of the switch unit received by the control device is the reset state, the control device is further configured to generate a switch unit state error indication signal to cause the indication device to indicate a state error of the switch unit.

5. The contactor according to claim 1, wherein the control device generating the switch control signal for controlling the wear indication and reset device based on the wear diagnosis alarm information stored in the memory comprises:
   the control device generating the switch control signal based on the wear diagnosis alarm information if the switch state information received by the control device when the contactor is powered on is the reset state and the switch state information stored in the memory is the reset state.

6. The contactor according to claim 1, wherein the contactor further comprises an indication device, and if the switch state information received by the control device when the contactor is powered on is the wear indication state and the switch state information stored in the memory is the reset state, the control device is further configured to generate a switch unit state error indication signal to cause the indication device to indicate a state error of the switch unit.

7. The contactor according to claim 1, wherein the contactor further comprises an indication device, if the switch state information received by the control device changes from the wear indication state to the reset state dur power-on of the contactor, the control device is further configured to generate a misoperation indication signal to cause the indication device to indicate a misoperation of the user.

8. An operation method of a contactor which comprises a contact, a control device, a wear indication and reset device, and a memory, wherein the wear indication and reset device comprises a switch unit, and switch states of the switch unit comprise a reset state and a wear indication state, and the operation method comprises steps of:
   by the control device:
      receiving switch state information of the switch unit from the wear indication and reset device;
      when the contactor is disconnected, acquiring wear information of the contact, generating wear diagnosis alarm information if wear of the contact reaches a wear threshold based on the wear information, and storing the wear diagnosis alarm information and the switch state information in the memory;
      generating a switch control signal for controlling the switch unit based on the wear diagnosis alarm information stored in the memory when the contactor is powered on;
   by the switch unit:
      entering the wear indication state based on the switch control signal, so that a remote device connected with the wear indication and reset device indicates a contact wear alarm;
   wherein the operation method further comprises steps of:
   by the switch unit:
      receiving a user's operation to cause the switch unit enter the reset state;
   by the control device:
      clearing the wear diagnosis alarm information in the memory based on the received switch state information being the reset state and the switch state information stored in the memory being the wear indication state when the contactor is powered on.

9. The operation method according to claim 8, wherein the contactor further comprises an indication device, and the operation method further comprises following steps performed by the control device:
   receiving connection information from the wear indication and reset device, and if the connection information is not received, not performing operations related to the wear indication and reset device, but causing the indication device to indicate contact wear alarm based on the wear diagnosis alarm information or clearing the wear diagnosis alarm information in the memory based on the user's operation.

10. The operation method according to claim 9, wherein the wear indication and reset device further comprises a detection unit, and the operation method further comprises following steps performed by the detection unit:
    transmitting the connection information to the control device;
    detecting the switch control signal from the control device and transmitting it to the switch unit; and
    detecting a switch state of the switch unit, and transmitting switch state information generated based on the switch state to the control device.

11. The operation method according to claim 8, wherein the contactor further comprises an indication device, and the operation method further comprises following steps performed by the control device:
    after a predetermined time threshold has elapsed since the control device generated the switch control signal, if the switch state information of the switch unit received by the control device is the reset state, generating a switch unit state error indication signal to cause the indication device to indicate a state error of the switch unit by the control device.

12. The operation method according to claim 8, wherein the control device generating the switch control signal for controlling the wear indication and reset device based on the wear diagnosis alarm information stored in the memory comprises:
    the control device generating the switch control signal based on the wear diagnosis alarm information if the switch state information received by the control device when the contactor is powered on is the reset state and the switch state information stored in the memory is the reset state.

13. The operation method according to claim 8, wherein the contactor further comprises an indication device, and the operation method further comprises following steps performed by the control device:
   if the switch state information received by the control device when the contactor is powered on is the wear indication state and the switch state information stored in the memory is the reset state, the control device generating a switch unit state error indication signal to cause the indication device to indicate a state error of the switch unit.

14. The operation method according to claim 8, wherein the contactor further comprises an indication device, and the operation method further comprises following steps performed by the control device:
   the control device generating a misoperation indication signal to cause the indication device to indicate a misoperation of the user if the switch state information received by the control device during the power-on of the contactor changes from the wear indication state to the reset state.

* * * * *